(12) United States Patent
Sun

(10) Patent No.: US 6,839,398 B2
(45) Date of Patent: Jan. 4, 2005

(54) SHIFT-REGISTER CIRCUIT

(75) Inventor: Wein-Town Sun, Kaohsiung (TW)

(73) Assignee: Au Optronics Corp., Hsinchu (TW)

( * ) Notice: Subject to any disclaimer, the term of this patent is extended or adjusted under 35 U.S.C. 154(b) by 37 days.

(21) Appl. No.: 10/379,131

(22) Filed: Mar. 4, 2003

(65) Prior Publication Data

US 2004/0017878 A1 Jan. 29, 2004

(30) Foreign Application Priority Data

Jul. 26, 2002 (TW) ........................................ 91116797 A

(51) Int. Cl.$^7$ ............................................. G11C 19/00
(52) U.S. Cl. .............................. 377/78; 377/79; 377/81
(58) Field of Search ................................ 377/78, 79, 81

(56) References Cited

U.S. PATENT DOCUMENTS 4,860,327 A * 8/1989 Nakagawa et al. ............ 377/79

* cited by examiner

Primary Examiner—Margaret R. Wambach
(74) Attorney, Agent, or Firm—Fish & Richardson P.C.

(57) ABSTRACT

A shift-register circuit. The input circuit receives the input pulse and outputs a high-voltage level input signal when the input pulse is at high voltage level. The level shifting circuit includes a first PMOS transistor having a first gate, a first drain and a first source coupled to a first voltage VDD, a second PMOS transistor having a second gate coupled to the first drain, a second drain coupled to the first gate and a second source coupled to the first voltage VDD, a first inverse logic gate coupled to the first drain and having an output terminal, a second inverse logic gate coupled to the second drain and having an inverse output terminal coupled to the input circuit, a first NMOS transistor having a third gate coupled to the input circuit, a third drain coupled to the first drain and a third source coupled to a second voltage VSS, a second NMOS transistor having a fourth gate coupled to the second gate and a fourth drain coupled to the second drain and a fourth source coupled to the second voltage VSS. The output circuit is coupled to the output terminal for outputting the shift-register signal.

14 Claims, 18 Drawing Sheets

SHIFT-REGISTER CIRCUIT

CROSS REFERENCE TO RELATED APPLICATIONS

Pursuant to 35 USC §119, this application claims the benefit of Taiwan Patent Application No. 91116797 filed Jul. 26, 2002.

BACKGROUND OF THE INVENTION

1. Field of the Invention

The present invention relates in general to a shift-register circuit. In particular, the present invention relates to a shift-register circuit of low temperature poly silicon (LTPS).

2. Description of the Related Art

U.S. Pat. No. 5,128,974 of Toshiba disclosed a conventional shift-register circuit in 1992. The conventional shift-register circuit comprises a latch composed of a pair of inverters. The data is pre-recorded in the latch and output when the clock pulses are changed. In addition, the clock pulses of the conventional shift-register circuit are connected to the gates of the transistors. Thus, power consumption is considerable when operated at high frequency.

SUMMARY OF THE INVENTION

The object of the present invention is thus to provide a shift-register circuit for LTPS circuit using latches to register data. In addition, the clock pulses of the shift-register circuit according to the present invention are connected to the sources of the transistors. Thus, the power consumption is reduced.

To achieve the above-mentioned object, the present invention provides a shift-register circuit. The input circuit receives the input pulse and outputs a high-voltage level input signal when the input pulse is at high voltage level. The level shifting circuit includes a first PMOS transistor having a first gate, a first drain and a first source coupled to a first voltage VDD, a second PMOS transistor having a second gate coupled to the first drain, a second drain coupled to the first gate and a second source coupled to the first voltage VDD, a first NMOS transistor having a third gate coupled to the first gate, a third drain coupled to the first drain and a third source coupled to an inverse input terminal, a second NMOS transistor having a fourth gate coupled to the second gate, a fourth drain coupled to the second drain and a fourth source coupled to an input terminal, a third NMOS transistor having a fifth gate coupled to the fourth source, a fifth drain coupled to the first source and a output terminal and a fifth source coupled to a second voltage VSS, a fourth NMOS transistor having a sixth gate coupled to the third source, a sixth drain coupled to the second drain and the input circuit and a sixth source coupled to the second voltage VSS, a fifth NMOS transistor having a seventh gate coupled to the input circuit, a seventh drain coupled to the third source and a seventh source coupled to the second voltage VSS and a sixth NMOS transistor having an eighth gate coupled to the input circuit, an eighth drain coupled to the fourth source and an eighth source coupled to the second voltage VSS. The output circuit is coupled to the output terminal for outputting the shift-register signal.

In addition, the present invention provides another shift-register circuit. The input circuit receives the input pulse and outputs a high-voltage level input signal when the input pulse is at high voltage level. The level shifting circuit includes a first PMOS transistor having a first gate, a first drain and a first source coupled to a first voltage VDD, a second PMOS transistor having a second gate coupled to the first drain, a second drain coupled to the first gate and a second source coupled to the first voltage VDD, a first inverse logic gate coupled to the first drain and having an output terminal, a second inverse logic gate coupled to the second drain and having an inverse output terminal coupled to the input circuit, a first NMOS transistor having a third gate coupled to the input circuit, a third drain coupled to the first drain and a third source coupled to a second voltage VSS, a second NMOS transistor having a fourth gate coupled to the second gate and a fourth drain coupled to the second drain and a fourth source coupled to the second voltage VSS. The output circuit is coupled to the output terminal for outputting the shift-register signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a shift-register circuit comprising a plurality of shift-register units connected in serial. The serial shift-register units output signals in turn. The input signal of the present-stage shift-register unit is the output signal of the pre-stage shift-register unit. The present-stage shift-register unit outputs a signal at a predetermined delay, and the output signal is input to the next-stage shift-register unit. Thus, the shift-register circuit outputs a plurality of pulses for driving LCD panel.

The detailed circuit of the shift-register unit is described in the following embodiments.

First Embodiment

Figure 1:
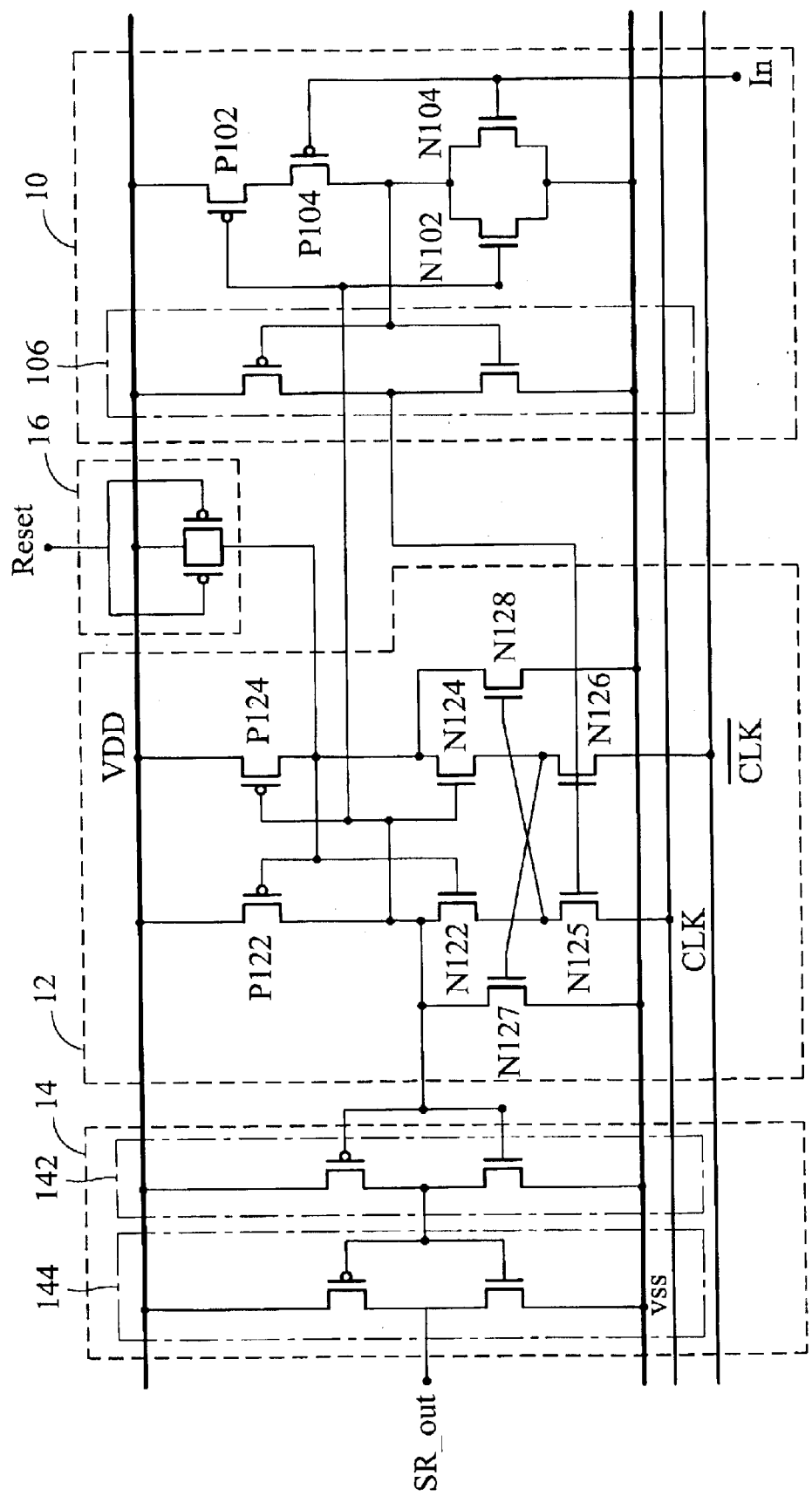
FIG. 1 shows a circuit of the shift-register unit according to the first embodiment of the present invention.

FIG. 1 shows a circuit of the shift-register unit according to the first embodiment of the present invention. The shift-register unit according to the first embodiment of the present invention comprises an input circuit 10, a level shifting circuit 12, an output circuit 14 and a reset circuit 16.

The input circuit 10 receives the output pulse SR_out of the pre-stage shift-register unit. The gates of the PMOS transistor P102 and the NMOS transistor N102 are connected, the source of the PMOS transistor P102 is coupled to a first voltage VDD and its drain is connected to the source of the PMOS transistor P104. The gates of the PMOS transistor P104 and the NMOS transistor N104 are connected and receive the input signal from the pre-stage shift-register unit.

In addition, the drains and the sources of the NMOS transistor N104 and N102 are connected, the connection point of the sources are connected to a second voltage VSS and the connection point of the drains is connected to an input of the inverse logic gate 106. The inverse logic gate 106 comprises a PMOS transistor and a NMOS transistor connected in serial. The output of the inverse logic gate 106 is connected to the level shifting circuit 12. Thus, the inverse logic gate 106 outputs high voltage level signal when the input signal is at high voltage level.

The level shifting circuit 12 outputs a signal SR_out according to a first clock CLK, a second clock $\overline{CLK}$ and the signal provided by the input circuit 10.

The sources of the PMOS transistor P122 and the PMOS transistor P124 are connected to the first voltage VDD, the gate of the PMOS transistor P122 is connected to the drain of the PMOS transistor P124 and the gate of the PMOS transistor P124 is connected to the drain of the PMOS transistor P122. The NMOS transistor N122 and the PMOS transistor P122 comprise an inverse logic gate. The drain of the NMOS transistor N125 is connected to the source of the NMOS transistor N122, and the source of the NMOS transistor N125 is connected to the first clock CLK. Similarly, the NMOS transistor N124 and the PMOS transistor P124 comprise an inverse logic gate. The drain of the NMOS transistor N126 is connected to the source of the NMOS transistor N124, and the source of the NMOS transistor N126 is connected to the second clock $\overline{CLK}$. In addition, the gates of the NMOS transistor N125 and the NMOS transistor N126 are connected to the output of the inverse logic gate 106.

The gate of the NMOS transistor N127 is connected to the drain of the NMOS transistor N126 and the source of the NMOS transistor N124 and its drain is connected to the output of the inverse logic gate composed by the NMOS transistor N122 and the PMOS transistor P122. The gate of the NMOS transistor N128 is connected to the drain of the NMOS transistor N125 and the source of the NMOS transistor N122 and its drain is connected to the output of the inverse logic gate composed by the NMOS transistor N124 and the PMOS transistor P124. In addition, both sources of the NMOS transistor N127 and NMOS transistor N128 are connected to the second voltage VSS.

The output circuit 14 comprises inverters 142 and 144 and acts as a buffer circuit for outputting the signal SR_out. The reset circuit 16 comprises two PMOS transistors, the drains and sources of which are connected and whose gates are connected to the reset signal RESET. The connection point of the drains is connected to the gate of the PMOS transistor P122 and the drain of the PMOS transistor P124. The first voltage VDD is input to the level shifting circuit 12 and lowers the output signal SR_out when the reset signal RESET is at low voltage level.

Figure 2:
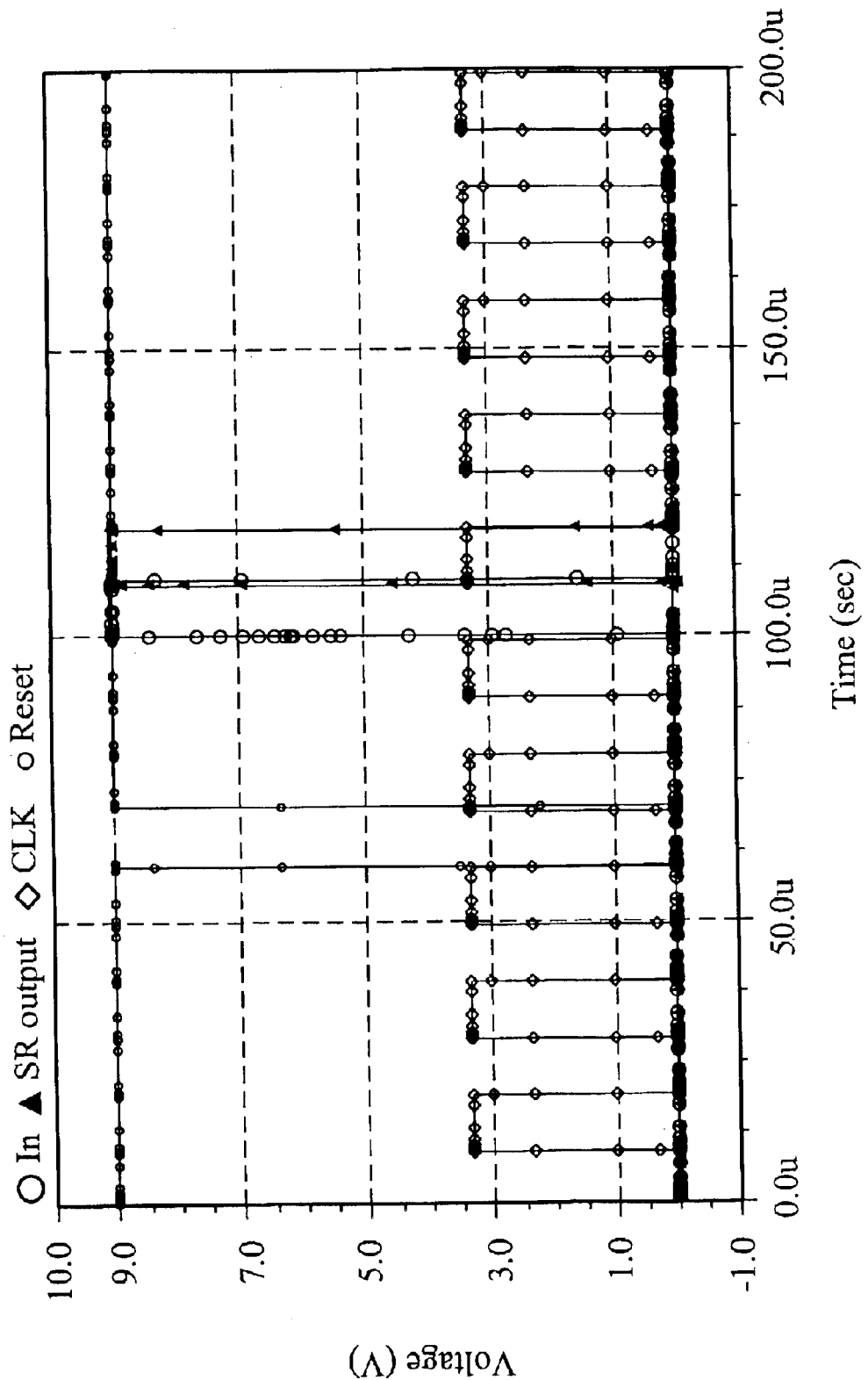
FIG. 2 shows a skeleton diagram of the shift-register units according to the first embodiment of the present invention.

FIG. 2 shows a skeleton diagram of the shift-register units according to the first embodiment of the present invention. The input pulse of the input terminal IN is shifted to a period of the signal CLK.

Figure 3:
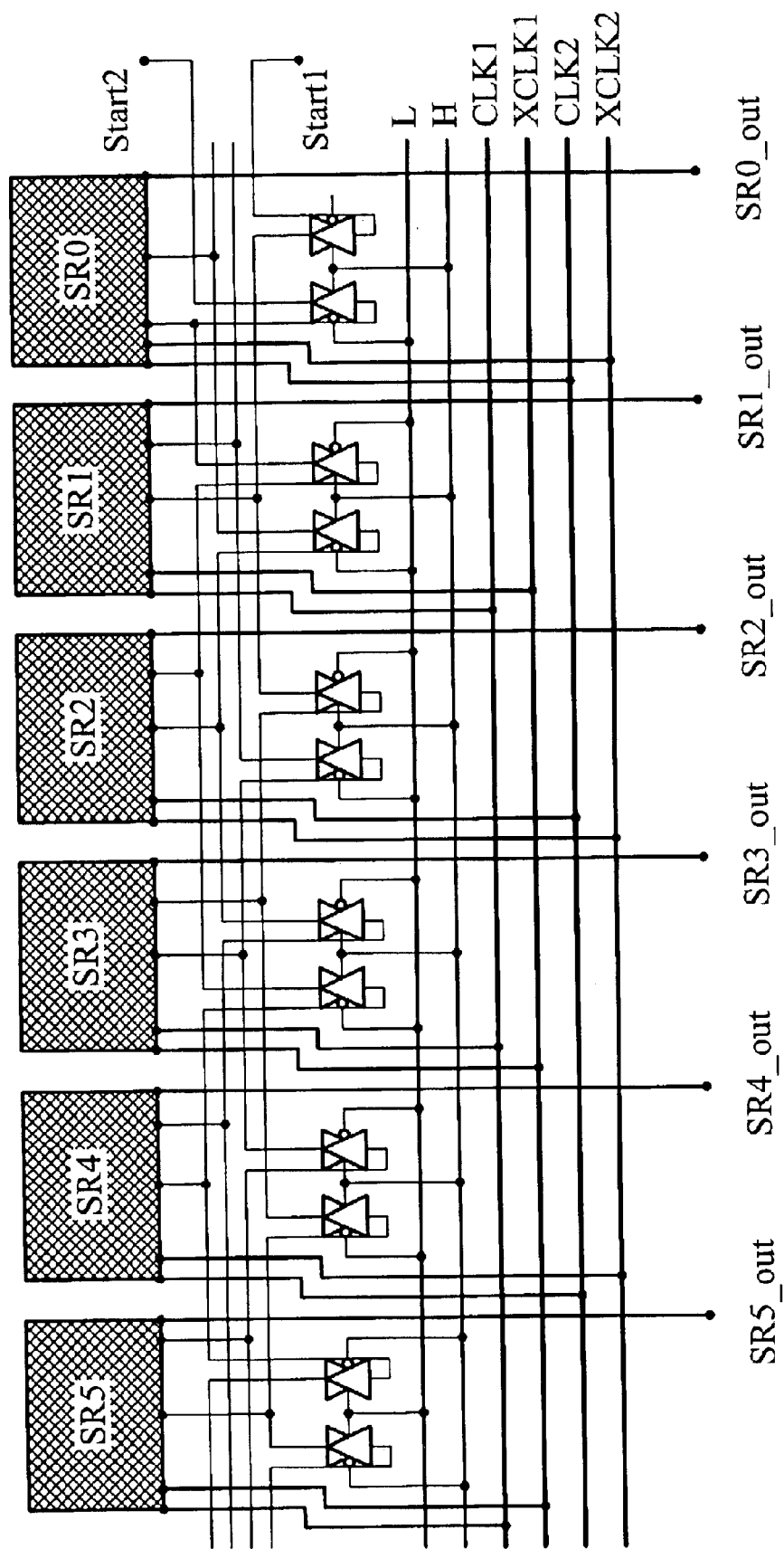
FIG. 3 shows a skeleton diagram of the six-stage shift-register circuit according to the embodiment of the present invention.
Figure 4:
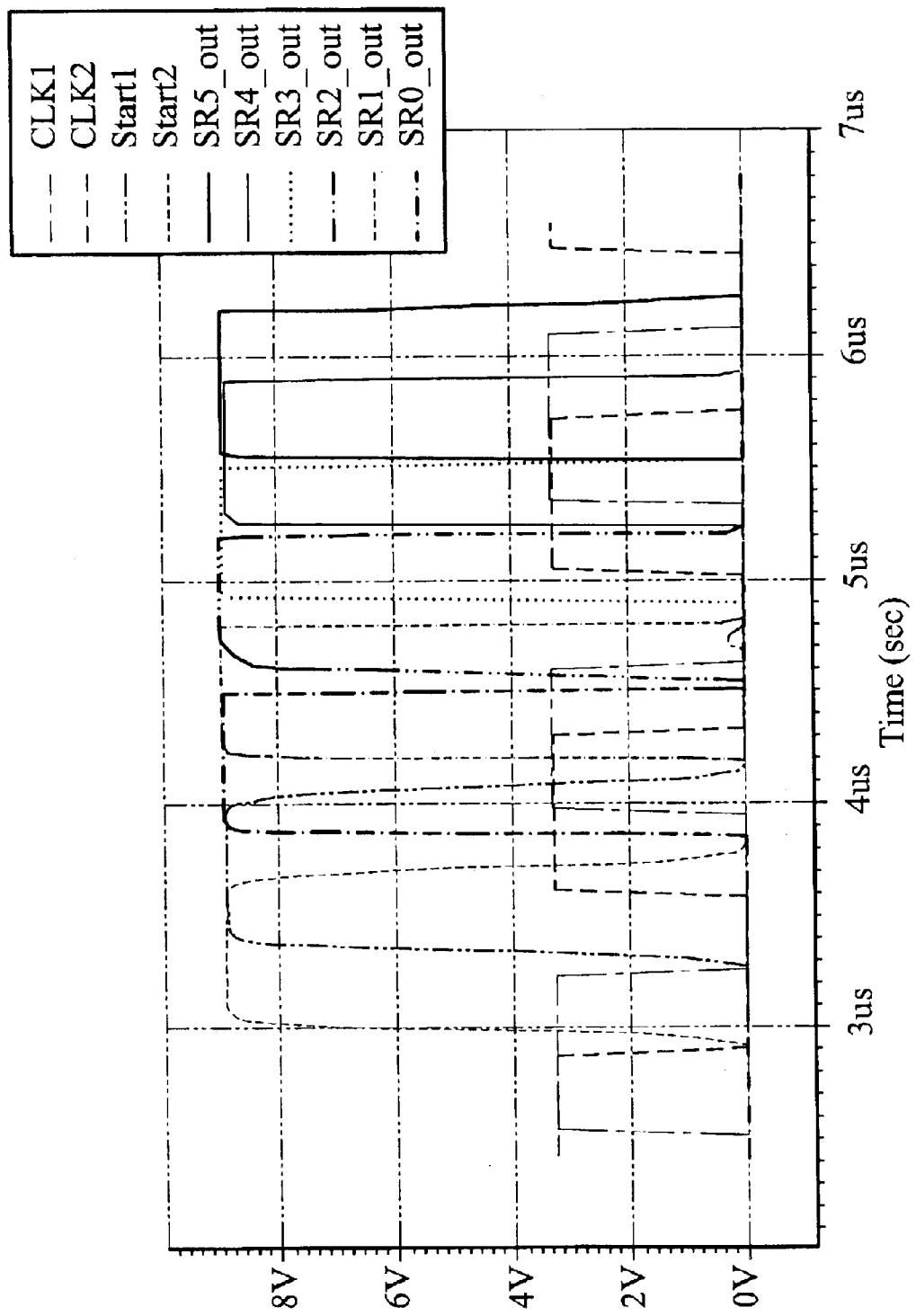
FIG. 4 shows a timing chart of the shift-register circuit according to the embodiment of the present invention.

FIG. 3 shows a skeleton diagram of the six-stage shift-register circuit according to the embodiment of the present invention. The labels SR0~SR5 represent six shift-register units connected in serial. FIG. 4 shows a timing chart of the shift-register circuit according to the embodiment of the present invention. The trigger signals Start1 and Start2 are delayed a period and each shift-register unit of the shift-register circuit according to the embodiment of the present invention outputs a pulse after the previous stage shift-register unit outputs a pulse at a predetermined period. Thus, the requirement of the shift-register circuit for LTPS driving circuit is achieved.

Second Embodiment

Figure 5:
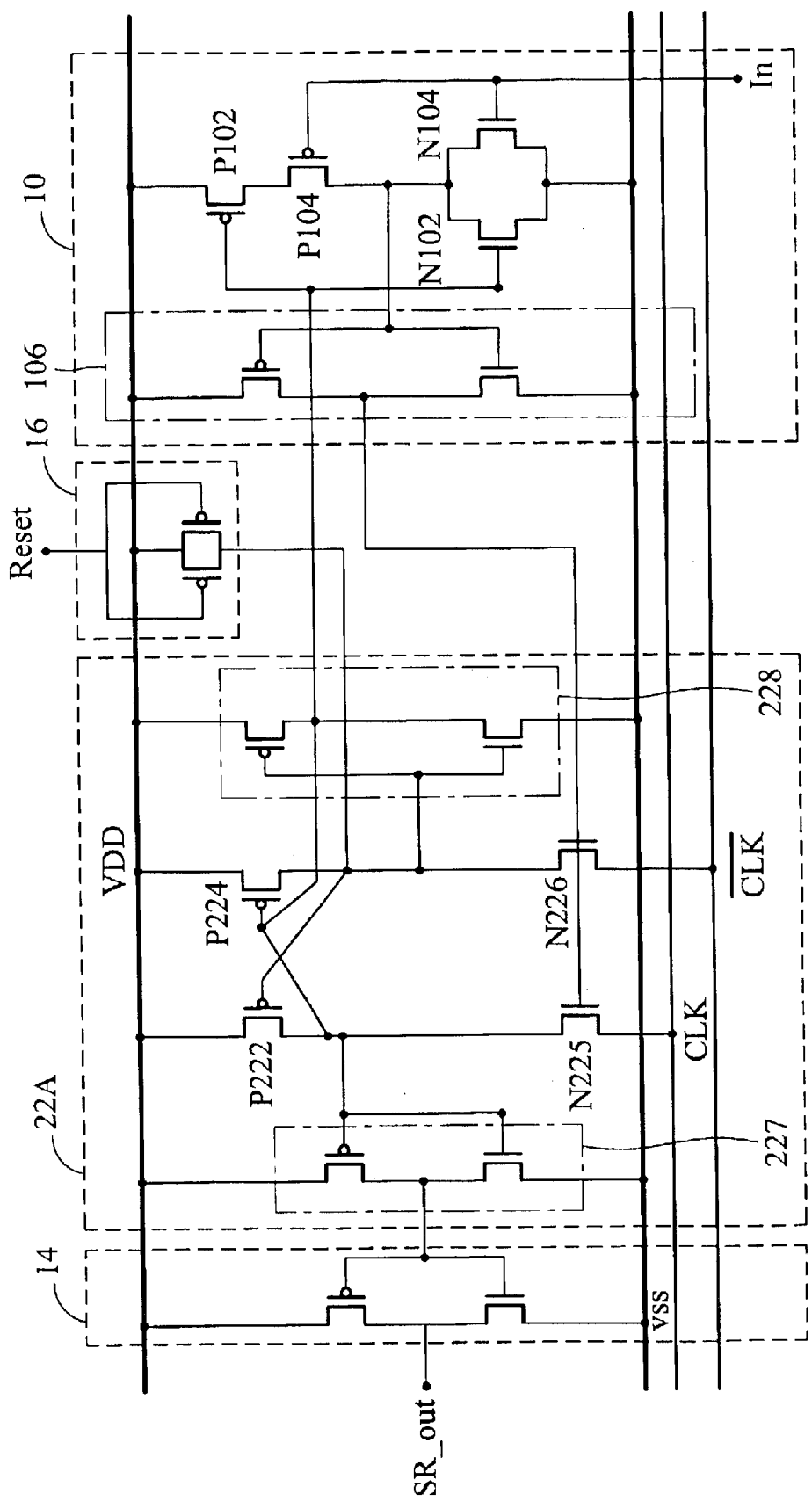
FIG. 5 shows a circuit of the shift-register unit according to the second embodiment of the present invention.

FIG. 5 shows a circuit of the shift-register unit according to the second embodiment of the present invention. The shift-register unit according to the second embodiment of the present invention comprises an input circuit 10, a level shifting circuit 22A, an output circuit 14 and a reset circuit 16.

The input circuit 10 receives the output pulse of the pre-stage shift-register unit. The gates of the PMOS transistor P102 and the NMOS transistor N102 are connected, the source of the PMOS transistor P102 is coupled to a first voltage VDD and its drain is connected to the source of the PMOS transistor P104. The gates of the PMOS transistor P104 and the NMOS transistor N104 are connected and receive the input signal from the pre-stage shift-register unit.

In addition, the drains and the sources of the NMOS transistor N104 and N102 are connected, the connection point of the sources are connected to a second voltage VSS and the connection point of the drains is connected to an input of the inverse logic gate 106. The inverse logic gate 106 comprises a PMOS transistor and a NMOS transistor connected in serial. The output of the inverse logic gate 106 is connected to the level shifting circuit 22A. Thus, the inverse logic gate 106 outputs high voltage level signal when the input signal is at high voltage level.

The level shifting circuit 22A outputs a signal SR_out according to a first clock CLK, a second clock $\overline{CLK}$ and the signal provided by the input circuit 10.

The sources of the PMOS transistor P222 and the PMOS transistor P224 are connected to the first voltage VDD, the gate of the PMOS transistor P222 is connected to the drain of the PMOS transistor P224 and the gate of the PMOS transistor P224 is connected to the drain of the PMOS transistor P222. The drains of the NMOS transistor N225 and the PMOS transistor P222 are connected and the source of the NMOS transistor N225 is connected to the first clock CLK. Similarly, the drains of the NMOS transistor N226 and the PMOS transistor P224 are connected and the source of the NMOS transistor N226 is connected to the second clock $\overline{\text{CLK}}$. The gates of the NMOS transistor N225 and the NMOS transistor N226 are connected to the output terminal of the inverse logic gate 106.

The input terminal of the inverse logic gate 227 is connected to the connection point of the NMOS transistor N225 and the PMOS transistor P222. The input terminal of the inverse logic gate 228 is connected to the connection point of the NMOS transistor N226 and the PMOS transistor P224 and its inverse output terminal is connected to the gate of the PMOS transistor P102.

The output circuit 14 acts as a buffer circuit for outputting the signal SR_out responding to the signal output from the inverse logic gate 227. The reset circuit 16 comprises two PMOS transistors, the drains and sources of which are connected and whose gates are connected to the reset signal RESET. The connection point of the drains is connected to the gate of the PMOS transistor P222 and the drain of the PMOS transistor P224. The first voltage VDD is input to the level shifting circuit 22A and lowers the output signal SR_out when the reset signal RESET is at low voltage level.

Figure 6:
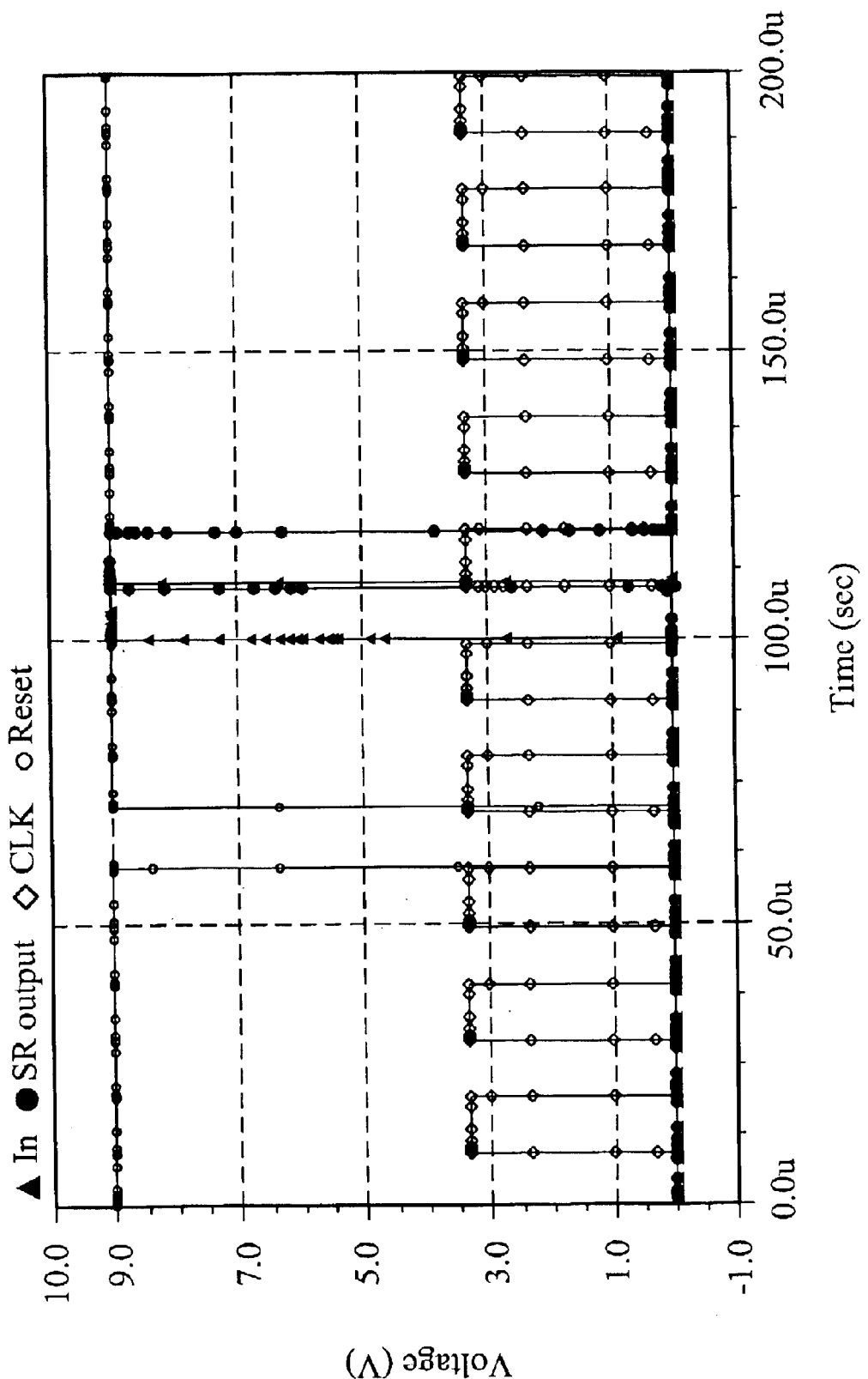
FIG. 6 shows a skeleton diagram of the shift-register units according to the second embodiment of the present invention.

FIG. 6 shows a skeleton diagram of the shift-register units according to the second embodiment of the present invention. The input pulse of the input terminal IN is shifted to a period of the signal CLK.

Third Embodiment

Figure 7:
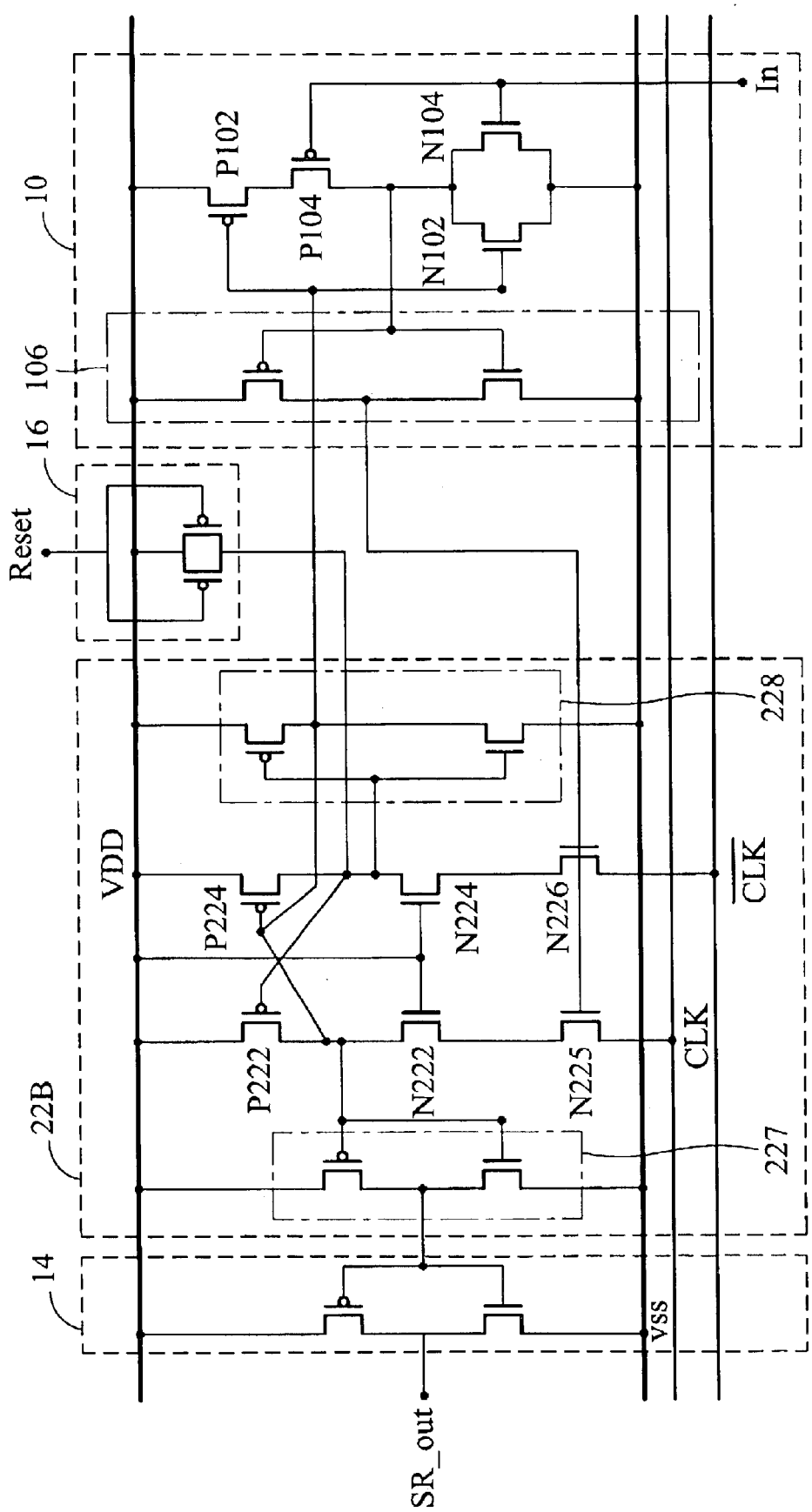
FIG. 7 shows a circuit of the shift-register unit according to the third embodiment of the present invention.

FIG. 7 shows a circuit of the shift-register unit according to the third embodiment of the present invention. The shift-register unit according to the third embodiment of the present invention comprises an input circuit 10, a level shifting circuit 22B, an output circuit 14 and a reset circuit 16.

The input circuit 10 receives the output pulse of the pre-stage shift-register unit. The gates of the PMOS transistor P102 and the NMOS transistor N102 are connected, the source of the PMOS transistor P102 is coupled to a first voltage VDD and its drain is connected to the source of the PMOS transistor P104. The gates of the PMOS transistor P104 and the NMOS transistor N104 are connected and receive the input signal from the pre-stage shift-register unit.

In addition, the drains and the sources of the NMOS transistor N104 and N102 are connected, the connection point of the sources are connected to a second voltage VSS and the connection point of the drains is connected to an input of the inverse logic gate 106. The inverse logic gate 106 comprises a PMOS transistor and a NMOS transistor connected in serial. The output of the inverse logic gate 106 is connected to the level shifting circuit 22B. Thus, the inverse logic gate 106 outputs high voltage level signal when the input signal is at high voltage level.

The level shifting circuit 22B outputs a signal SR_out according to a first clock CLK, a second clock $\overline{\text{CLK}}$ and the signal provided by the input circuit 10.

The sources of the PMOS transistor P222 and the PMOS transistor P224 are connected to the first voltage VDD, the gate of the PMOS transistor P222 is connected to the drain of the PMOS transistor P224 and the gate of the PMOS transistor P224 is connected to the drain of the PMOS transistor P222. The gates of the NMOS transistor N222 and N224 are all connected to the first voltage VDD, and their drains are connected to the drains of the PMOS transistor P222 and P224, respectively. The drain of the NMOS transistor N225 is connected to the source of the NMOS transistor N222 and its source is connected to the first clock CLK. Similarly, the drain of the NMOS transistor N226 is connected to the source of the NMOS transistor N224 and its source is connected to the second clock $\overline{\text{CLK}}$. In addition, the gates of the NMOS transistor N225 and the NMOS transistor N226 are connected to the output terminal of the inverse logic gate 106.

The input terminal of the inverse logic gate 227 is connected to the connection point of the NMOS transistor N222 and the PMOS transistor P222. The input terminal of the inverse logic gate 228 is connected to the connection point of the NMOS transistor N224 and the PMOS transistor P224 and its inverse output terminal is connected to the gate of the PMOS transistor P102.

The output circuit 14 acts as a buffer circuit for outputting the signal SR_out responding to the signal output from the inverse logic gate 227. The reset circuit 16 comprises two PMOS transistors, the drains and sources of which are connected and whose gates are connected to the reset signal RESET. The connection point of the drains is connected to the gate of the PMOS transistor P222 and the drain of the PMOS transistor P224. The first voltage VDD is input to the level shifting circuit 22B and lowers the output signal SR_out when the reset signal RESET is at low voltage level.

Figure 8:
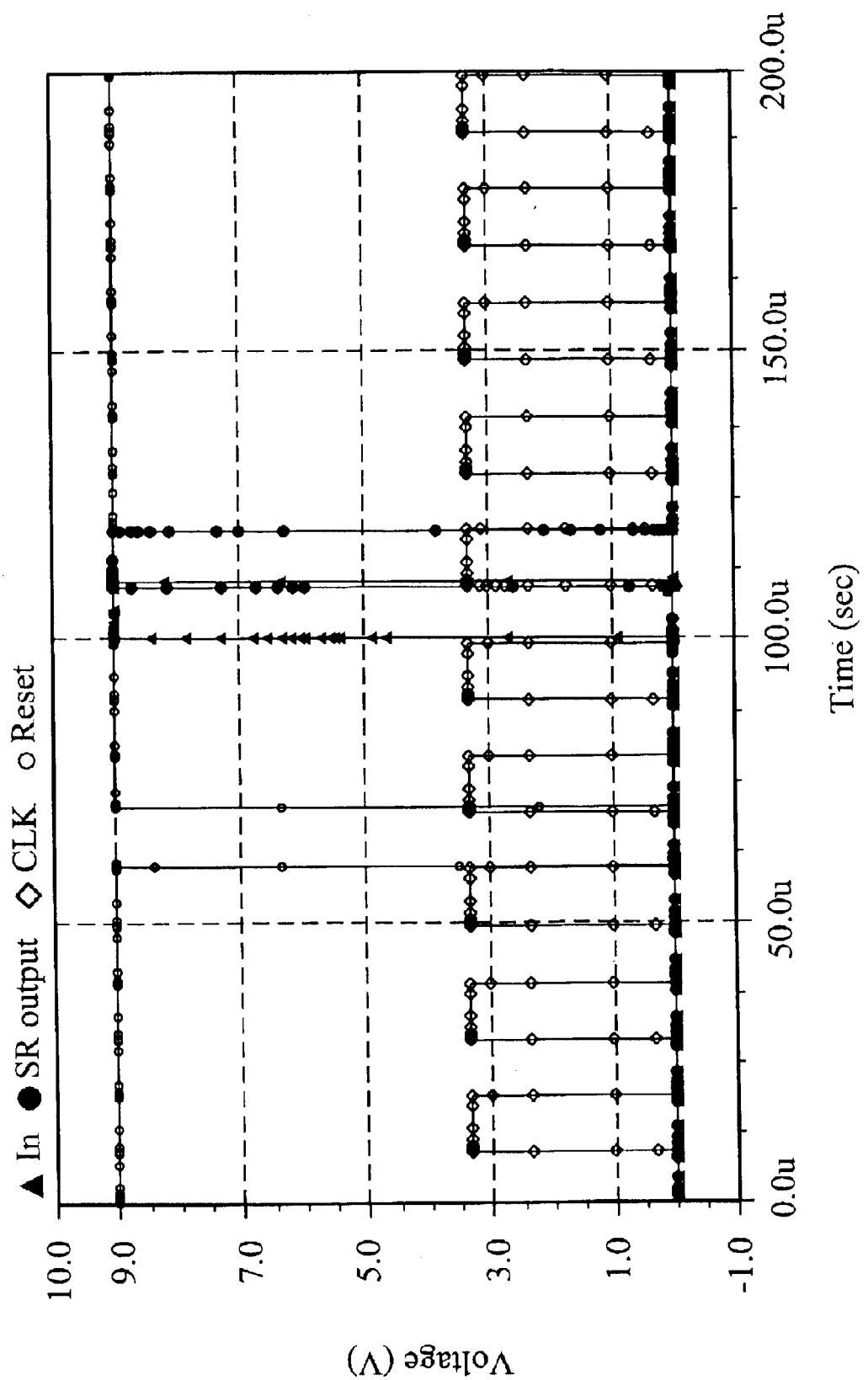
FIG. 8 shows a skeleton diagram of the shift-register units according to the third embodiment of the present invention.

FIG. 8 shows a skeleton diagram of the shift-register units according to the third embodiment of the present invention. The input pulse of the input terminal IN is shifted to a period of the signal CLK.

Fourth Embodiment

Figure 9:
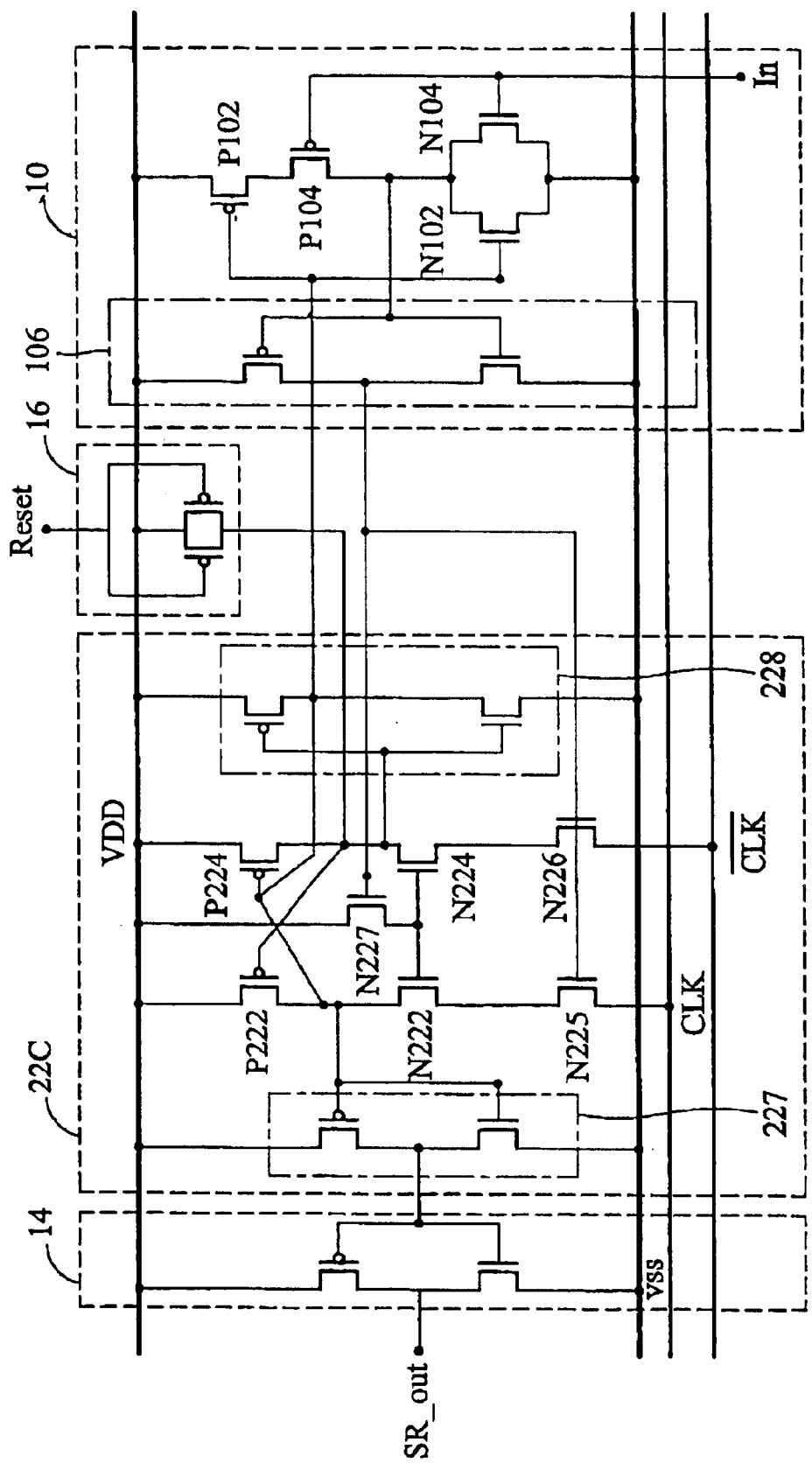
FIG. 9 shows a circuit of the shift-register unit according to the fourth embodiment of the present invention.

FIG. 9 shows a circuit of the shift-register unit according to the fourth embodiment of the present invention. The shift-register unit according to the fourth embodiment of the present invention comprises an input circuit 10, a level shifting circuit 22C, an output circuit 14 and a reset circuit 16.

The input circuit 10 receives the output pulse of the pre-stage shift-register unit. The gates of the PMOS transistor P102 and the NMOS transistor N102 are connected, the source of the PMOS transistor P102 is coupled to a first voltage VDD and its drain is connected to the source of the PMOS transistor P104. The gates of the PMOS transistor P104 and the NMOS transistor N104 are connected and receive the input signal from the pre-stage shift-register unit.

In addition, the drains and the sources of the NMOS transistor N104 and N102 are connected, the connection point of the sources are connected to a second voltage VSS and the connection point of the drains is connected to an input of the inverse logic gate 106. The inverse logic gate 106 comprises a PMOS transistor and a NMOS transistor connected in serial. The output of the inverse logic gate 106 is connected to the level shifting circuit 22C. Thus, the inverse logic gate 106 outputs high voltage level signal when the input signal is at high voltage level.

The level shifting circuit 22C outputs a signal SR_out according to a first clock CLK, a second clock $\overline{\text{CLK}}$ and the signal provided by the input circuit 10.

The sources of the PMOS transistor P222 and the PMQS transistor P224 are connected to the first voltage VDD, the gate of the PMOS transistor P222 is connected to the drain of the PMOS transistor P224 and the gate of the PMOS transistor P224 is connected to the drain of the PMOS transistor P222. The gates of the NMOS transistor N227 is connected to the output terminal of the inverse logic gate 106 and its drain is connected to the first voltage VDD. The gates of the NMOS transistor N222 and N224 are all connected to source of the NMOS transistor N227, and their drains are connected to the drains of the PMOS transistor P222 and P224, respectively. The drain of the NMOS transistor N225 is connected to the source of the NMOS transistor N222 and its source is connected to the first clock CLK. Similarly, the drain of the NMOS transistor N226 is connected to the source of the NMOS transistor N224 and its source is connected to the second clock $\overline{CLK}$. In addition, the gates of the NMOS transistor N225 and the NMOS transistor N226 are connected to the output terminal of the inverse logic gate 106.

The input terminal of the inverse logic gate 227 is connected to the connection point of the NMOS transistor N222 and the PMOS transistor P222. The input terminal of the inverse logic gate 228 is connected to the connection point of the NMOS transistor N224 and the PMOS transistor P224 and its inverse output terminal is connected to the gate of the PMOS transistor P102.

The output circuit 14 acts as a buffer circuit for outputting the signal SR_out responding to the signal output from the inverse logic gate 227. The reset circuit 16 comprises two PMOS transistors, the drains and sources of which are connected and whose gates are connected to the reset signal RESET. The connection point of the drains is connected to the gate of the PMOS transistor P222 and the drain of the PMOS transistor P224. The first voltage VDD is input to the level shifting circuit 22C and lowers the output signal SR_out when the reset signal RESET is at low voltage level.

Figure 10:
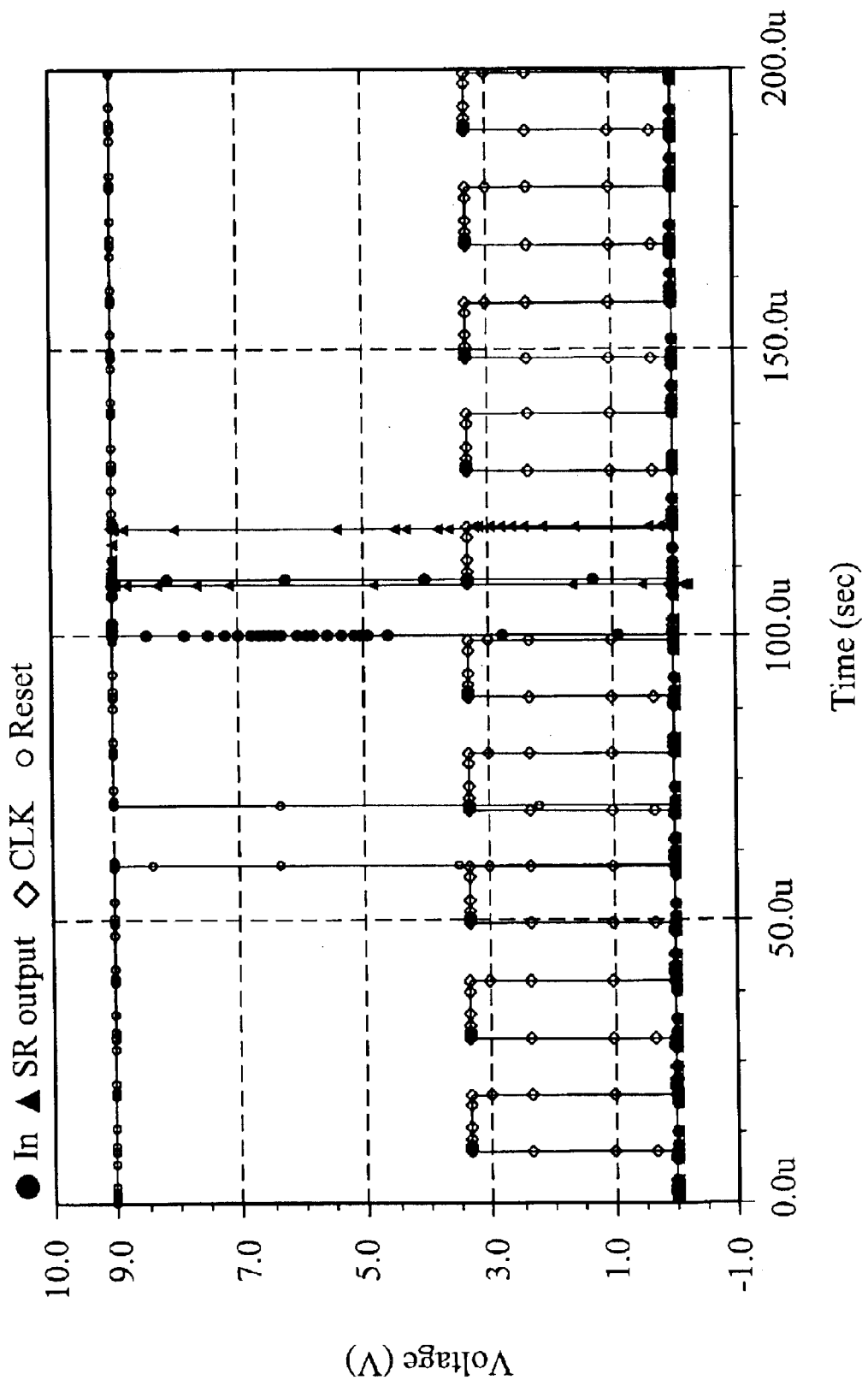
FIG. 10 shows a skeleton diagram of the shift-register units according to the fourth embodiment of the present invention.

FIG. 10 shows a skeleton diagram of the shift-register units according to the fourth embodiment of the present invention. The input pulse of the input terminal IN is shifted to a period of the signal CLK.

Figure 11:
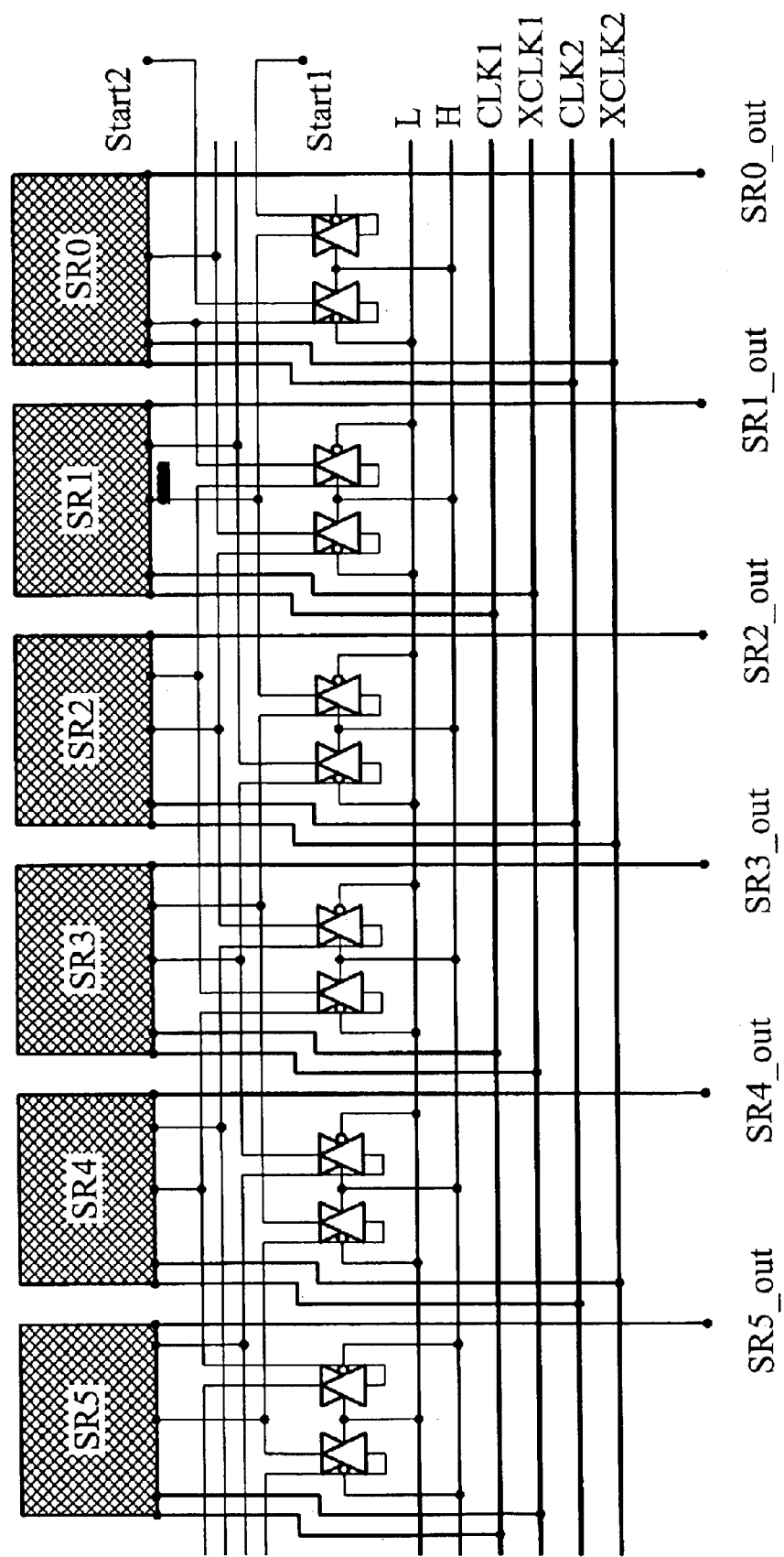
FIG. 11 shows a skeleton diagram of the six-stage shift-register circuit according to the second, third and fourth embodiments of the present invention.
Figure 12:
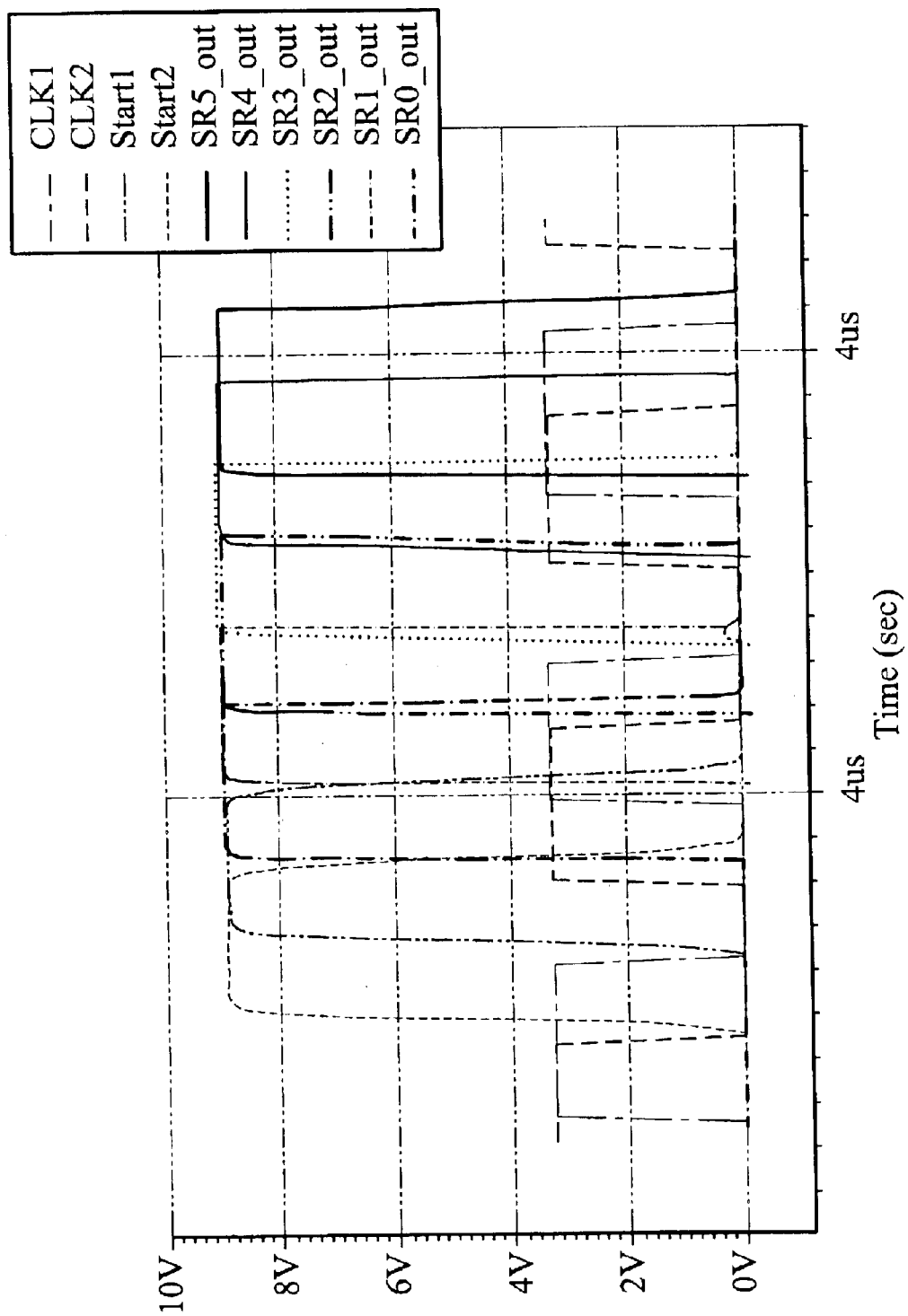
FIG. 12 shows a timing chart of the shift-register circuit according to the second, third and fourth embodiments of the present invention.

FIG. 11 shows a skeleton diagram of the six-stage shift-register circuit according to the second, third and fourth embodiments of the present invention. The labels SR0~SR5 represent six shift-register units connected in serial. FIG. 12 shows a timing chart of the shift-register circuit according to the fourth embodiment of the present invention. The trigger signals Start1 and Start2 are delayed a period and each shift-register unit of the shift-register circuit according to the embodiment of the present invention outputs a pulse after the previous stage shift-register unit outputs a pulse at a predetermined period. Thus, the requirement of the shift-register circuit for LTPS driving circuit is achieved. In addition, the timing charts of the shift-register circuit according to the second and third embodiments of the present invention are similar to FIG. 12, so the requirement of the shift-register circuit for LTPS driving circuit is also achieved.

Fifth Embodiment

Figure 13:
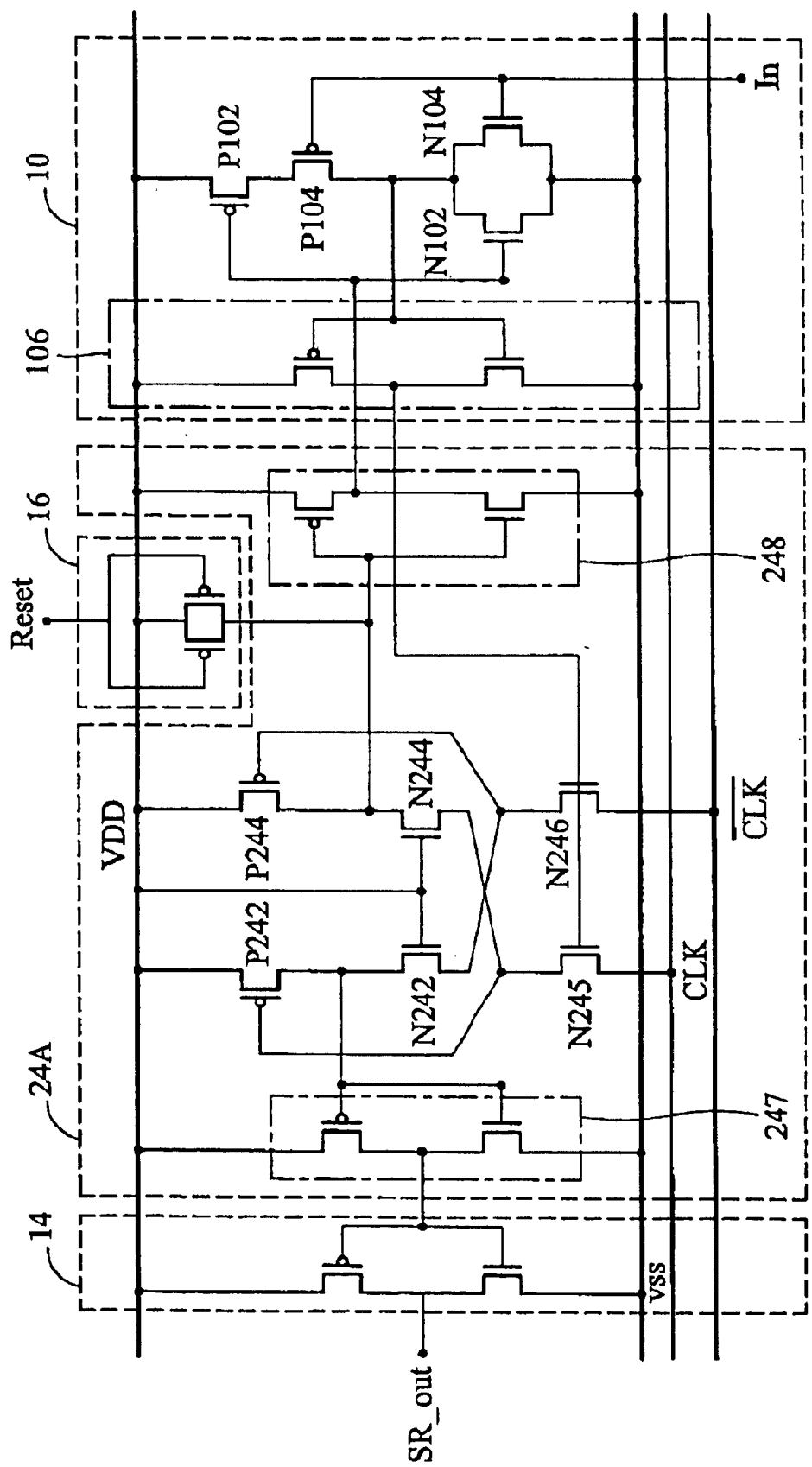
FIG. 13 shows a circuit of the shift-register unit according to the fifth embodiment of the present invention.

FIG. 13 shows a circuit of the shift-register unit according to the fifth embodiment of the present invention. The shift-register unit according to the fifth embodiment of the present invention comprises an input circuit 10, a level shifting circuit 24A, an output circuit 14 and a reset circuit 16.

The input circuit 10 receives the output pulse of the pre-stage shift-register unit. The gates of the PMOS transistor P102 and the NMOS transistor N102 are connected, the source of the PMOS transistor P102 is coupled to a first voltage VDD and its drain is connected to the source of the PMOS transistor P104. The gates of the PMOS transistor P104 and the NMOS transistor N104 are connected and receive the input signal from the pre-stage shift-register unit.

In addition, the drains and the sources of the NMOS transistor N104 and N102 are connected, the connection point of the sources are connected to a second voltage VSS and the connection point of the drains is connected to an input of the inverse logic gate 106. The inverse logic gate 106 comprises a PMOS transistor and a NMOS transistor connected in serial. The output of the inverse logic gate 106 is connected to the level shifting circuit 24A. Thus, the inverse logic gate 106 outputs high voltage level signal when the input signal is at high voltage level.

The level shifting circuit 24A outputs a signal SR_out according to a first clock CLK, a second clock $\overline{CLK}$ and the signal provided by the input circuit 10.

The sources of the PMOS transistor P242 and the PMOS transistor P244 are connected to the first voltage VDD, the gates of the NMOS transistors N242 and N244 are all connected to the first voltage VDD and their drains are connected to the drains of the PMOS transistor P242 and P244, respectively. The drain of the NMOS transistor N245 is coupled to the source of the NMOS transistor N244 and the gate of the PMOS transistor P242, and its source is coupled to the first clock CLK. Similarly, the drain of the NMOS transistor N246 is coupled to the source of the NMOS transistor N242 and the gate of the PMOS transistor P244, and its source is coupled to the second clock $\overline{CLK}$. In addition, the gates of the NMOS transistor N245 and the NMOS transistor N246 are connected to the output terminal of the inverse logic gate 106.

The input terminal of the inverse logic gate 247 is connected to the connection point of the NMOS transistor N242 and the PMOS transistor P242. The input terminal of the inverse logic gate 248 is connected to the connection point of the NMOS transistor N244 and the PMOS transistor P244 and its inverse output terminal is connected to the gate of the PMOS transistor P102.

The output circuit 14 acts as a buffer circuit for outputting the signal SR_out responding to the signal output from the inverse logic gate 247. The reset circuit 16 comprises two PMOS transistors, the drains and sources of which are connected and whose gates are connected to the reset signal RESET. The connection point of the drains is connected to the drain of the PMOS transistor P244 and the output terminal of the inverse logic gate 247. The first voltage VDD is input to the level shifting circuit 24A and lowers the output signal SR_out when the reset signal RESET is at low voltage level.

Figure 14:
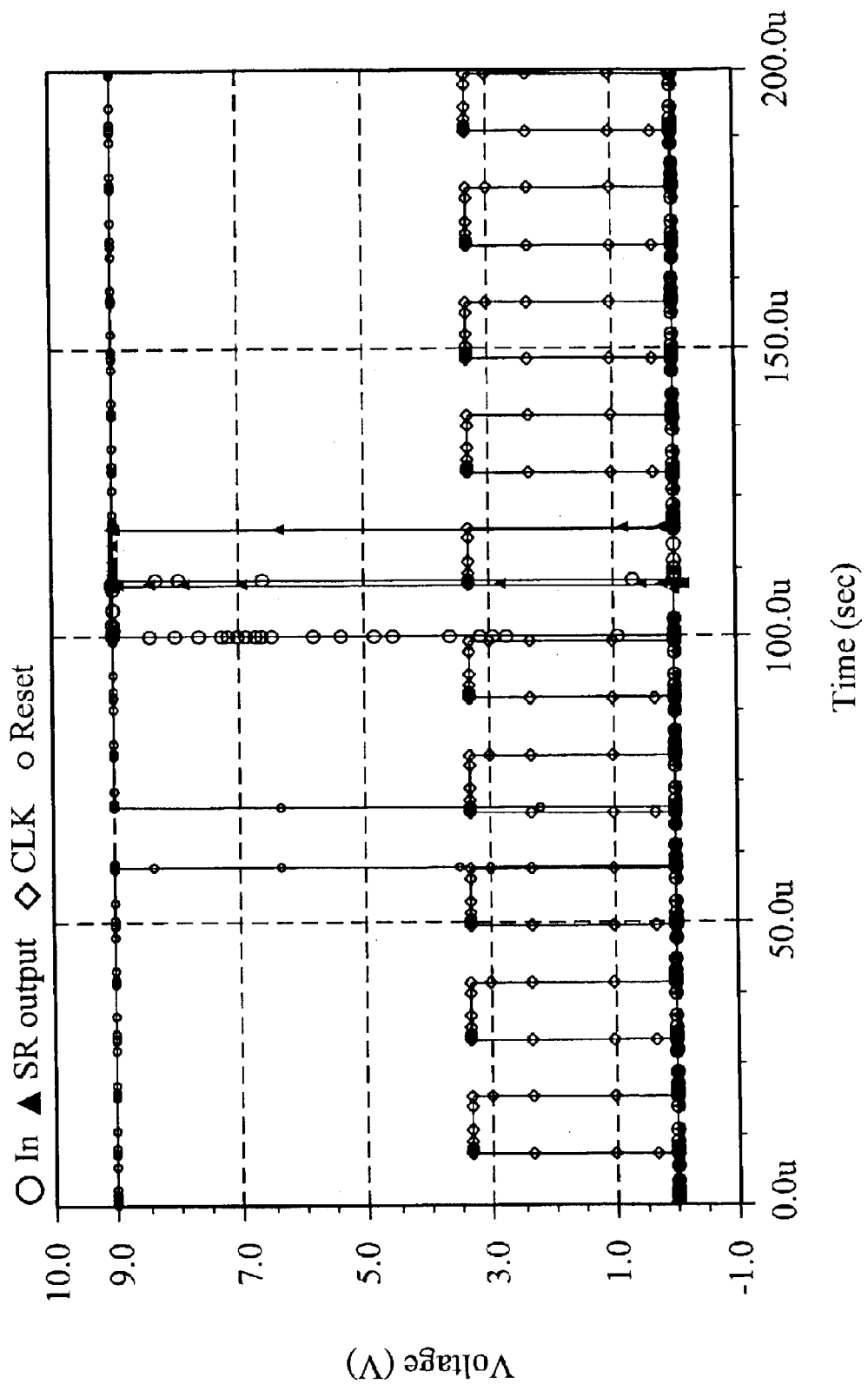
FIG. 14 shows a skeleton diagram of the shift-register units according to the fifth embodiment of the present invention.

FIG. 14 shows a skeleton diagram of the shift-register units according to the fifth embodiment of the present invention. The input pulse of the input terminal IN is shifted to a period of the signal CLK.

Figure 15:
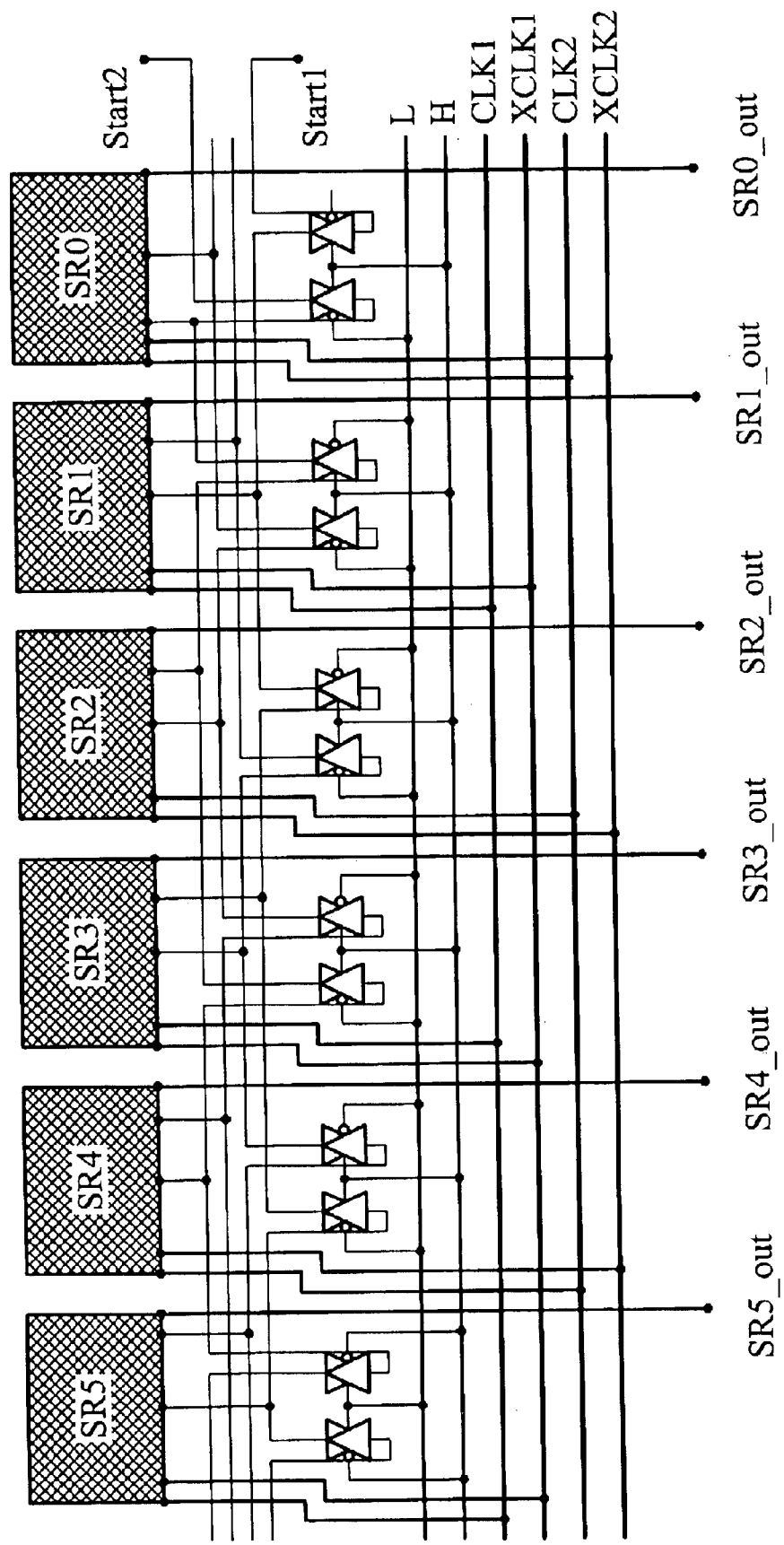
FIG. 15 shows a skeleton diagram of the six-stage shift-register circuit according to the fifth embodiment of the present invention.
Figure 16:
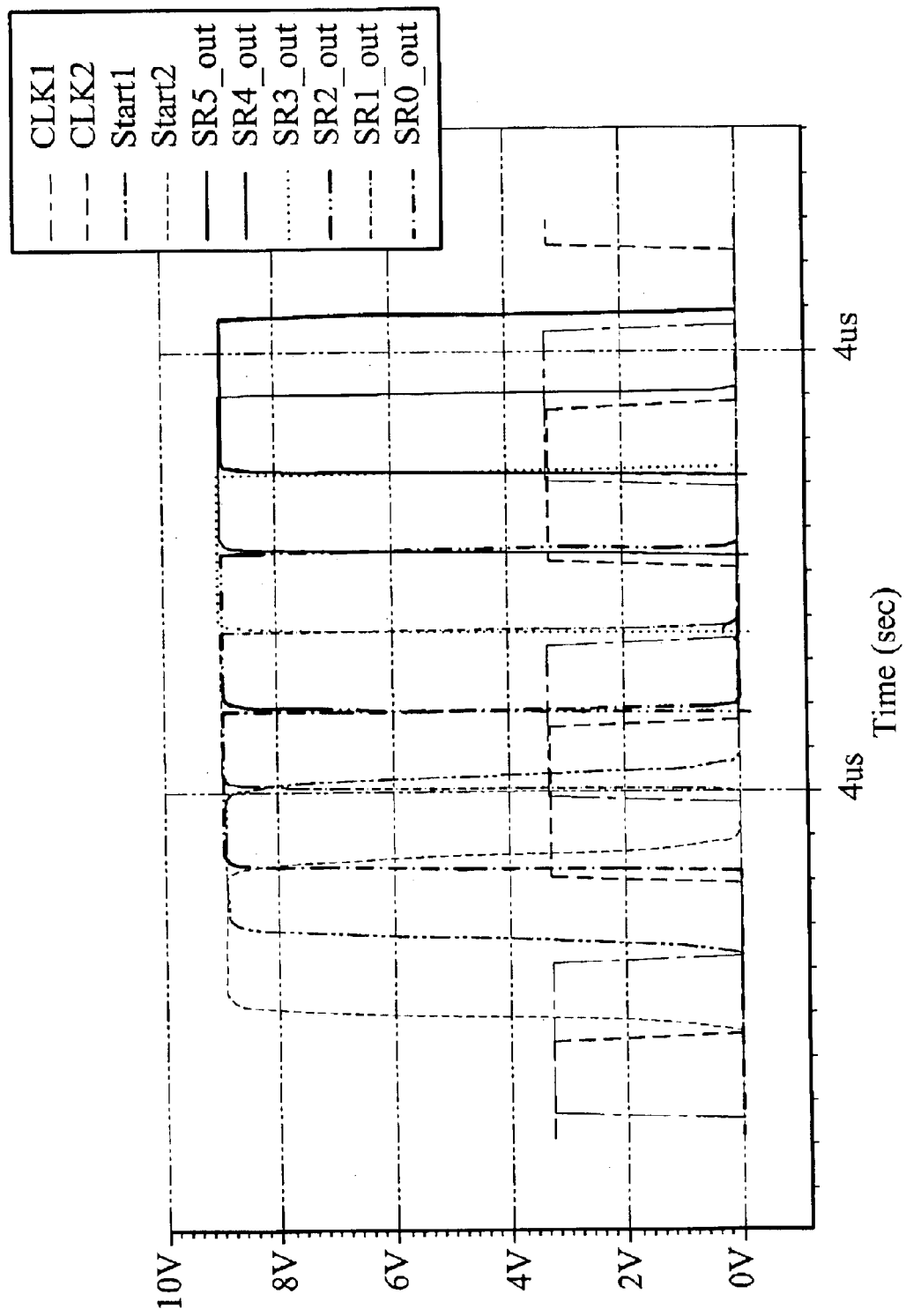
FIG. 16 shows a timing chart of the shift-register circuit according to the fifth embodiment of the present invention.

FIG. 15 shows a skeleton diagram of the six-stage shift-register circuit according to the embodiment of the present invention. The labels SR0~SR5 represent six shift-register units connected in serial. FIG. 16 shows a timing chart of the shift-register circuit according to the embodiment of the present invention. The trigger signals Start1 and Start2 are delayed a period and each shift-register unit of the shift-register circuit according to the embodiment of the present invention outputs a pulse after the previous stage shift-register unit outputs a pulse at a predetermined period. Thus, the requirement of the shift-register circuit for LTPS driving circuit is achieved.

Sixth Embodiment

Figure 17:
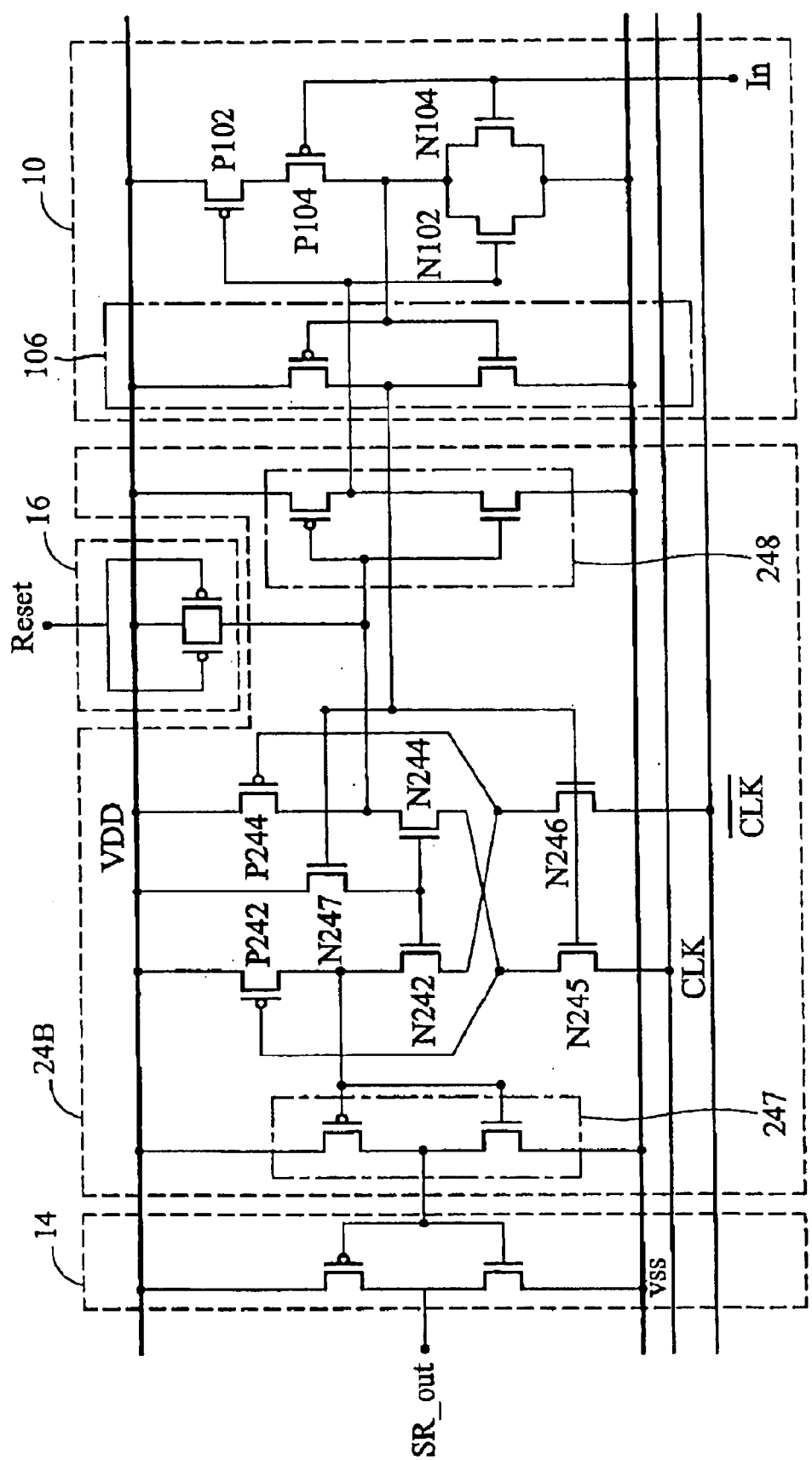
FIG. 17 shows a skeleton diagram of the six-stage shift-register circuit according to the sixth embodiment of the present invention.

FIG. 17 shows a circuit of the shift-register unit according to the sixth embodiment of the present invention. The shift-register unit according to the sixth embodiment of the present invention comprises an input circuit 10, a level shifting circuit 24B, an output circuit 14 and a reset circuit 16.

The input circuit 10 receives the output pulse of the pre-stage shift-register unit. The gates of the PMOS transistor P102 and the NMOS transistor N102 are connected, the source of the PMOS transistor P102 is coupled to a first voltage VDD and its drain is connected to the source of the PMOS transistor P104. The gates of the PMOS transistor P104 and the NMOS transistor N104 are connected and receive the input signal from the pre-stage shift-register unit.

In addition, the drains and the sources of the NMOS transistor N104 and N102 are connected, the connection point of the sources are connected to a second voltage VSS and the connection point of the drains is connected to an input of the inverse logic gate 106. The inverse logic gate 106 comprises a PMOS transistor and a NMOS transistor connected in serial. The output of the inverse logic gate 106 is connected to the level shifting circuit 24B. Thus, the inverse logic gate 106 outputs high voltage level signal when the input signal is at high voltage level.

The level shifting circuit 24B outputs a signal SR_out according to a first clock CLK, a second clock $\overline{\text{CLK}}$ and the signal provided by the input circuit 10.

The sources of the PMOS transistor P242 and the PMOS transistor P244 are connected to the first voltage VDD. The gates of the NMOS transistors N242 and N244 are all connected to the source of the NMOS transistors N247. The drain of the NMOS transistors N247 is connected to the first voltage VDD and its gate is connected to the output terminal of the inverse logic gate 106.

The drains of the NMOS transistors N242 and N244 are connected to the drains of the PMOS transistor P242 and P244, respectively. The drain of the NMOS transistor N245 is coupled. to the source of the NMOS transistor N244 and the gate of the PMOS transistor P242, and its source is coupled to the first clock CLK. Similarly, the drain of the NMOS transistor N246 is coupled to the source of the NMOS transistor N242 and the gate of the PMOS transistor P244, and its source is coupled to the second clock $\overline{\text{CLK}}$. In addition, the gates of the NMOS transistor N245 and the NMOS transistor N246 are connected to the output terminal of the inverse logic gate 106.

The input terminal of the inverse logic gate 247 is connected to the connection point of the NMOS transistor N242 and the PMOS transistor P242. The input terminal of the inverse logic gate 248 is connected to the connection point of the NMOS transistor N244 and the PMOS transistor P244 and its inverse output terminal is connected to the gate of the PMOS transistor P102.

The output circuit 14 acts as a buffer circuit for outputting the signal SR_out responding to the signal output from the inverse logic gate 247. The reset circuit 16 comprises two PMOS transistors, the drains and sources of which are connected and whose gates are connected to the reset signal RESET. The connection point of the drains is connected to the drain of the PMOS transistor P244 and the output terminal of the inverse logic gate 247. The first voltage VDD is input to the level shifting circuit 24B and lowers the output signal SR_out when the reset signal RESET is at low voltage level.

Figure 18:
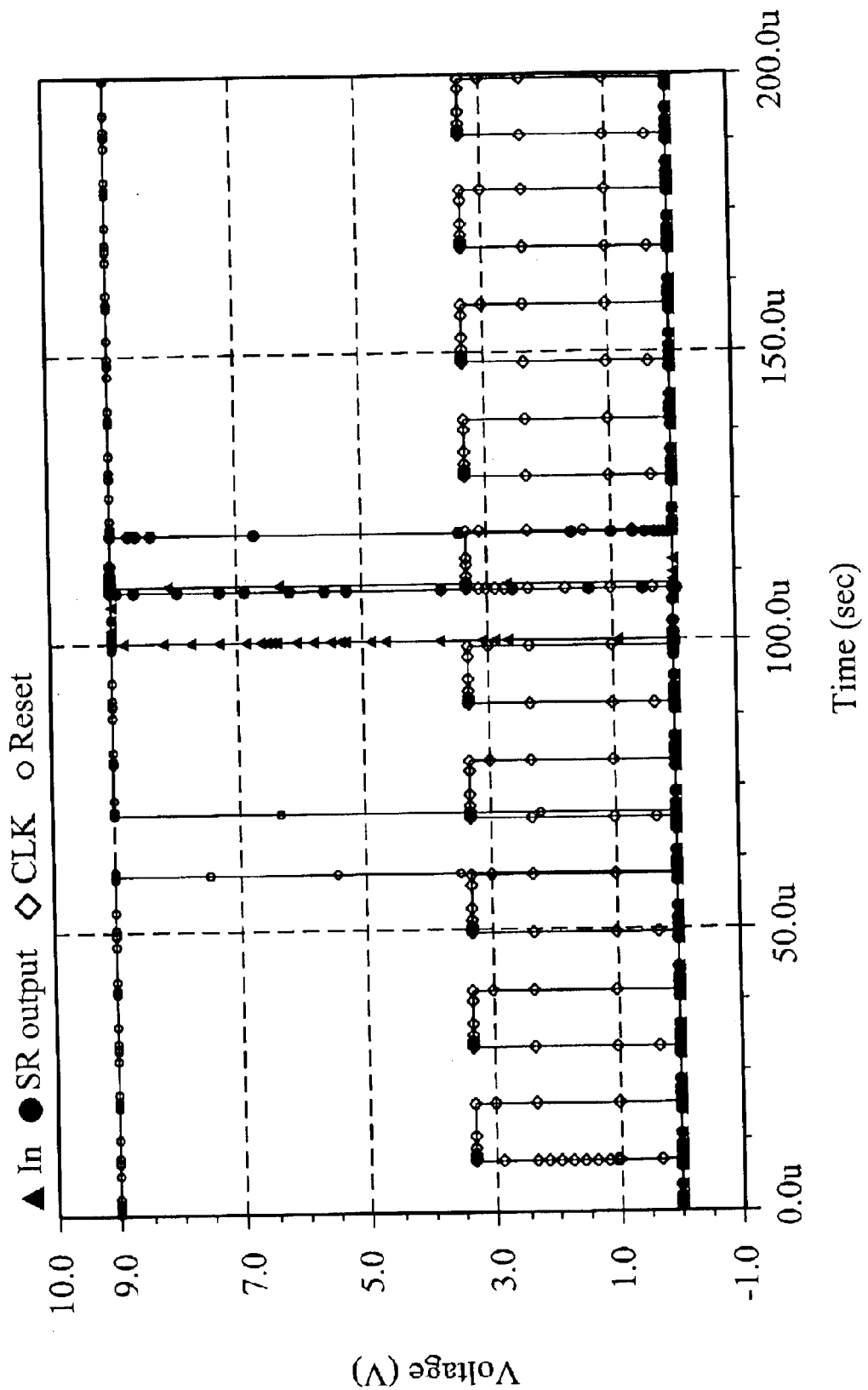
FIG. 18 shows a timing chart of the shift-register circuit according to the sixth embodiment of the present invention.

FIG. 18 shows a skeleton diagram of the shift-register units according to the fifth embodiment of the present invention. The input pulse of the input terminal IN is shifted to a period of the signal CLK. FIG. 15 shows a skeleton diagram of the six-stage shift-register circuit according to the embodiment of the present invention. Similar to the fifth embodiment, the labels SR0~SR5 represent six shift-register units connected in serial. In addition, the timing chart of the shift-register circuit according to the present embodiment is similar to the FIG. 14. Thus, the requirement of the shift-register circuit for LTPS driving circuit is achieved.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A shift-register circuit for a first clock signal, a second clock signal and an input pulse to output a shift-register signal, comprising:

an input circuit for receiving the input pulse and outputting a high-voltage level input signal when the input pulse is at high voltage level;

a level shifting circuit coupled to the input circuit, comprising:

a first PMOS transistor having a first gate, a first drain and a first source coupled to a first voltage VDD;

a second PMOS transistor having a second gate coupled to the first drain, a second drain coupled to the first gate and a second source coupled to the first voltage VDD;

a first NMOS transistor having a third gate coupled to the first gate, a third drain coupled to the first drain, and a third source;

a second NMOS transistor having a fourth gate coupled to the second gate, a fourth drain coupled to the second drain and a fourth source;

a third NMOS transistor having a fifth gate coupled to the fourth source, a fifth drain coupled to the first drain and an output terminal, and a fifth source coupled to a second voltage VSS;

a fourth NMOS transistor having a sixth gate coupled to the third source, a sixth drain coupled to the second drain, and a sixth source coupled to the second voltage VSS;

a fifth NMOS transistor having a seventh gate coupled to the input circuit, a seventh drain coupled to the third source and a seventh source coupled to the first clock signal;

a sixth NMOS transistor having an eighth gate coupled to the input circuit, an eighth drain coupled to the fourth source and an eighth source coupled to the second clock signal; and an output circuit coupled to the output terminal for outputting the shift-register signal.

2. The shift-register circuit as claimed in claim 1, wherein the input circuit comprises:

a third PMOS transistor having a ninth gate coupled to the second gate, a ninth drain and a ninth source coupled to the first voltage VDD;

a fourth PMOS transistor having a tenth gate coupled to the input pulse, a tenth drain and a tenth source coupled to the ninth drain;

a seventh NMOS transistor having an eleventh gate coupled to the ninth gate, an eleventh drain coupled to the tenth drain and an eleventh source coupled to the second voltage VSS;

an eighth NMOS transistor having a twelfth gate coupled to the input pulse, a twelfth drain coupled to the tenth drain and a twelfth source coupled to the second voltage VSS; and an inverse logic gate coupled between the first voltage VDD and the second voltage VSS and having an input terminal coupled to the tenth drain and an output terminal coupled to the seventh gate and the eighth gate.

3. The shift-register circuit as claimed in claim 1, further comprising a reset circuit coupled to the first gate and the second drain for providing the first voltage VDD.

4. A shift-register circuit for a first clock signal, a second clock signal and an input pulse to output a shift-register signal, comprising:
   an input circuit for receiving the input pulse and outputting a high-voltage level input signal when the input pulse is at high voltage level;
   a level shifting circuit coupled to the input circuit, comprising:
   a first PMOS transistor having a first gate, a first drain and a first source coupled to a first voltage VDD;
   a second PMOS transistor having a second gate coupled to the first drain, a second drain coupled to the first gate and a second source coupled to the first voltage VDD;
   a first inverse logic gate coupled to the first drain and having an output terminal;
   a second inverse logic gate coupled to the second drain and having an inverse output terminal coupled to the input circuit;
   a first NMOS transistor having a third gate coupled to the input circuit, a third drain coupled to the first drain and a third source coupled to the first clock signal;
   a second NMOS transistor having a fourth gate coupled to the input circuit, a fourth drain coupled to the second drain and a fourth source coupled to the second clock signal; and
   an output circuit coupled to the output terminal for outputting the shift-register signal.

5. The shift-register circuit as claimed in claim 4, wherein the input circuit comprises:
   a third PMOS transistor having a fifth gate coupled to the second gate, a fifth drain and a fifth source coupled to the first voltage VDD;
   a fourth PMOS transistor having a sixth gate coupled to the input pulse, a sixth drain and a sixth source coupled to the fifth drain;
   a third NMOS transistor having a seventh gate coupled to the fifth gate, a seventh drain coupled to the sixth drain and a seventh source coupled to the second voltage VSS;
   a fourth NMOS transistor having an eighth gate coupled to the input pulse, an eighth drain coupled to the sixth drain and an eighth source coupled to the second voltage VSS; and
   a third inverse logic gate coupled between the first voltage VDD and the second voltage VSS and having its input terminal coupled to the sixth drain and its output terminal coupled to the third gate and the fourth gate.

6. The shift-register circuit as claimed in claim 4, further comprising a reset circuit coupled to the first gate and the second drain for providing the first voltage VDD.

7. A shift-register circuit for a first clock signal, a second clock signal and an input pulse to output a shift-register signal, comprising:
   an input circuit for receiving the input pulse and outputting a high-voltage level input signal when the input pulse is at high voltage level;
   a level shifting circuit coupled to the input circuit, comprising:
   a first PMOS transistor having a first gate, a first drain and a first source coupled to a first voltage VDD;
   a second PMOS transistor having a second gate coupled to the first drain, a second drain coupled to the first gate and a second source coupled to the first voltage VDD;
   a first inverse logic gate coupled to the first drain and having an output terminal;
   a second inverse logic gate coupled to the second drain and having an inverse output terminal;
   a first NMOS transistor having a third gate coupled to the first voltage VDD, a third drain coupled to the first drain and a third source;
   a second NMOS transistor having a fourth gate coupled to the first voltage VDD, a fourth source and a fourth drain coupled to the second drain;
   a third NMOS transistor having a fifth gate, a fifth drain coupled to the third source and a fifth source coupled to the first clock signal;
   a fourth NMOS transistor having a sixth gate, a sixth drain coupled to the fourth source, and a sixth source coupled to the second clock signal; and
   an output circuit coupled to the output terminal for outputting the shift-register signal.

8. The shift-register circuit as claimed in claim 7, wherein the input circuit comprises:
   a third PMOS transistor having a seventh gate coupled to the second gate, a seventh drain and a seventh source coupled to the first voltage VDD;
   a fourth PMOS transistor having an eighth gate coupled to the input pulse, an eighth drain and an eighth source coupled to the seventh drain;
   a fifth NMOS transistor having a ninth gate coupled to the seventh gate, a ninth drain coupled to the eighth drain and a ninth source coupled to the second voltage VSS;
   a sixth NMOS transistor having a tenth gate coupled to the input pulse, a tenth drain coupled to the eighth drain and a tenth source coupled to the second voltage VSS; and
   a third inverse logic gate coupled between the first voltage VDD and the second voltage VSS and having its input terminal coupled to the eighth drain and its output terminal coupled to the fifth gate and the sixth gate.

9. The shift-register circuit as claimed in claim 7, further comprising a reset circuit coupled to the first gate and the second drain for providing the first voltage VDD.

10. The shift-register circuit as claimed in claim 7, further comprising a seventh NMOS transistor having its gate coupled to the input circuit, its drain coupled to the first voltage VDD and its source coupled to the connection point of the third gate and the fourth gate.

11. A shift-register circuit for a first clock signal, a second clock signal and an input pulse to output a shift-register signal, comprising:
   an input circuit for receiving the input pulse and outputting a high-voltage level input signal when the input pulse is at high voltage level;
   a level shifting circuit coupled to the input circuit, comprising:
   a first PMOS transistor having a first gate, a first drain and a first source coupled to a first voltage VDD;
   a second PMOS transistor having a second gate, a second drain and a second source coupled to the first voltage VDD;
   a first inverse logic gate coupled to the first drain and having an output terminal;
   a second inverse logic gate coupled to the second drain and having an inverse output terminal;
   a first NMOS transistor having a third gate coupled to the first voltage VDD, a third drain coupled to the first drain and a third source;

a second NMOS transistor having a fourth gate coupled to the first voltage VDD, a fourth source and a fourth drain coupled to the second drain;

a third NMOS transistor having a fifth gate coupled to the input circuit, a fifth drain coupled to the first gate and the fourth source and a fifth source coupled to the first clock signal;

a fourth NMOS transistor having a sixth gate coupled to the input circuit, a sixth drain coupled to the third source and the second gate and a sixth source coupled to the second clock signal; and an output circuit coupled to the output terminal for outputting the shift-register signal.

12. The shift-register circuit as claimed in claim 11, wherein the input circuit comprises:

a third PMOS transistor having a seventh gate coupled to the inverse output terminal, a seventh drain and a seventh source coupled to the first voltage VDD;

a fourth PMOS transistor having an eighth gate coupled to the input pulse, an eighth drain and an eighth source coupled to the seventh drain;

a fifth NMOS transistor having a ninth gate coupled to the seventh gate, a ninth drain coupled to the eighth drain and a ninth source coupled to the second voltage VSS;

a sixth NMOS transistor having a tenth gate coupled to the input pulse, a tenth drain coupled to the eighth drain and a tenth source coupled to the second voltage VSS; and a third inverse logic gate coupled between the first voltage VDD and the second voltage VSS and having its input terminal coupled to the eighth drain and its output terminal coupled to the fifth gate and the sixth gate.

13. The shift-register circuit as claimed in claim 11, further comprising a reset circuit coupled to the second drain for providing the first voltage VDD.

14. The shift-register circuit as claimed in claim 11, further comprising a seventh NMOS transistor having its gate coupled to the input circuit, its drain coupled to the first voltage VDD and its source coupled to the connection point of the third gate and the fourth gate.

* * * * *